(12) United States Patent
Jang et al.

(10) Patent No.: US 10,770,331 B2
(45) Date of Patent: Sep. 8, 2020

(54) SEMICONDUCTOR WAFER DEVICE AND MANUFACTURING METHOD THEREOF

(71) Applicant: TAIWAN SEMICONDUCTOR MANUFACTURING COMPANY LTD., Hsinchu (TW)

(72) Inventors: Bor-Ping Jang, Hsin-Chu County (TW); Chien Ling Hwang, Hsinchu (TW); Hsin-Hung Liao, Taipei (TW); Yeong-Jyh Lin, Nantou County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/105,893

(22) Filed: Aug. 20, 2018

(65) Prior Publication Data
US 2018/0358255 A1    Dec. 13, 2018

Related U.S. Application Data

(60) Continuation of application No. 15/790,797, filed on Oct. 23, 2017, now Pat. No. 10,056,285, which is a division of application No. 14/968,573, filed on Dec. 14, 2015, now Pat. No. 9,812,346, which is a division of application No. 14/049,898, filed on Oct. 9, 2013, now Pat. No. 9,236,351.

(51) Int. Cl.
*H01L 21/683*    (2006.01)
*H01L 23/544*    (2006.01)
*H01L 21/78*    (2006.01)
*B23K 26/364*    (2014.01)
*B23K 26/40*    (2014.01)
*B23K 26/402*    (2014.01)
*B23K 103/00*    (2006.01)

(52) U.S. Cl.
CPC ........ *H01L 21/6835* (2013.01); *B23K 26/364* (2015.10); *B23K 26/40* (2013.01); *B23K 26/402* (2013.01); *H01L 21/78* (2013.01); *H01L 23/544* (2013.01); *B23K 2103/50* (2018.08); *H01L 2221/68327* (2013.01); *H01L 2924/0002* (2013.01); *Y02P 80/30* (2015.11)

(58) Field of Classification Search
CPC . H01L 51/56; H01L 51/0097; H01L 51/5246; H01L 2251/5338; H01L 51/5253
USPC ........................................................ 438/107
See application file for complete search history.

(56) References Cited

U.S. PATENT DOCUMENTS

| | | | |
|---|---|---|---|
| 6,528,864 B1 * | 3/2003 | Arai | H01L 21/3043 257/620 |
| 2005/0158967 A1 * | 7/2005 | Huang | H01L 21/78 438/460 |
| 2011/0033787 A1 * | 2/2011 | Lin | G03F 7/70433 430/30 |

* cited by examiner

*Primary Examiner* — Andy Huynh
(74) *Attorney, Agent, or Firm* — WPAT, P.C., Intellectual Property Attorneys; Anthony King

(57) ABSTRACT

A semiconductor device includes a carrier having a first central axis extending along a first direction and a second central axis extending along a second direction, a plurality of dies disposed on a surface of the carrier, and a plurality of scribing lines separating the plurality of dies from each other. The plurality of scribing lines include a plurality of continuous lines along the first direction and a plurality of discontinuous lines along the second direction, at least one of the plurality of continuous lines overlaps the first central axis, at least one of the plurality of discontinuous lines overlaps the second central axis. The plurality of dies are symmetrically arranged on the carrier about the first central axis and the second central axis.

20 Claims, 14 Drawing Sheets

| Die Size (mm x mm) | Original Layout Quantity (ea) | Optimized Layout Quantity (ea) | Increment % |
|---|---|---|---|
| 16 x 16 | 230 | 238 | 3.4 % |
| 22 x 22 | 112 | 118 | 5.4 % |
| 24 x 24 | 97 | 102 | 5.2 % |
| 24 x 26 | 84 | 92 | 9.5 % |
| 25 x 25 | 92 | 94 | 2.1 % |
| 26 x 26 | 82 | 84 | 2.4 % |
| 26 x 32 | 64 | 67 | 4.7 % |

FIG. 3

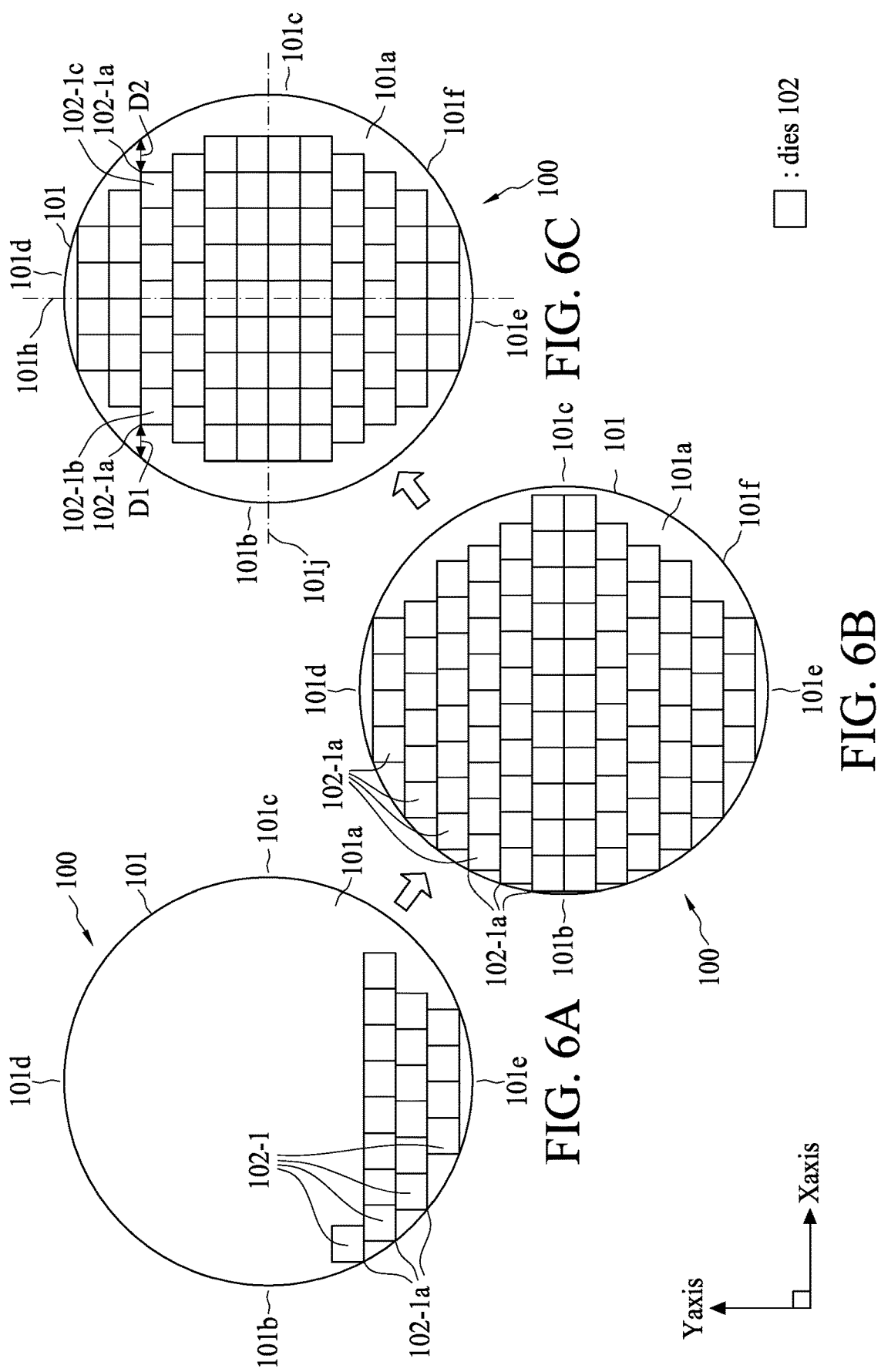

SEMICONDUCTOR WAFER DEVICE AND MANUFACTURING METHOD THEREOF

PRIORITY CLAIM AND CROSS-REFERENCE

This is a continuation application of U.S. patent application Ser. No. 15/790,797, filed Oct. 23, 2017, which is a divisional application of U.S. patent application Ser. No. 14/968,573, entitled "SEMICONDUCTOR WAFER DEVICE AND MANUFACTURING METHOD THEREOF" filed on Dec. 14, 2015, which is a divisional application of U.S. patent application Ser. No. 14/049,898 filed on Oct. 9, 2013, entitled "SEMICONDUCTOR WAFER DEVICE," the disclosure of which is hereby incorporated by reference in its entirety.

BACKGROUND

Electronic equipment involving numbers of semiconductor devices are indispensable from our daily life. The semiconductor device includes numbers of dies or chips which are configured for executing and performing different functions. With the advancement of electronic technology, each electronic equipment has to execute and perform more and more complicated and multiple functions, and thus the electronic equipment involves more and more numbers of dies or chips within the electronic equipment.

The die is manufactured from a carrier such as semiconductor wafer. The carrier is configured for supporting numbers of dies on the surface of the carrier. The carrier is divided by numbers of scribing lines on a surface of the carrier. The scribing lines are continuous straight lines across the carrier. The dies are arranged on the carrier in numbers of horizontal rows and vertical columns as a matrix according to the numbers of scribing lines. The carrier is sawed by a sawing tool such as mechanical blade or laser blade, and thus the dies are singulated from the carrier by cutting the carrier according the numbers of scribing lines.

As there are some constraints on the dies singulation operations, the dies are required to be disposed in the numbers of rows and columns and thus in a matrix or chessboard layout. However, such layout of the carrier has not fully utilized the surface of the carrier for manufacturing the dies, particularly the carrier is a wafer which is in circular shape. Some areas near an edge of the carrier cannot be utilized efficiently, and thus numbers of incomplete dies are formed near the edge of the carrier and formation of incomplete dies would lead to material wastage issue. As such, there is a continuous demand on improving the configuration of the carrier for manufacturing operations to optimize quantity of dies manufactured from the carrier and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 is a table of relationship between size of the die, number of dies disposed on a carrier and an increment of the number of dies in accordance with some embodiments of the present disclosure.

FIG. 6A is a schematic view of a semiconductor device disposed with several dies one by one and row by row in accordance with some embodiments of the present disclosure.

FIG. 6B is a schematic view of a semiconductor device disposed with several dies in a staggered configuration in accordance with some embodiments of the present disclosure.

FIG. 6C is a schematic view of a semiconductor device disposed with several dies at a center of a carrier in accordance with some embodiments of the present disclosure.

DETAILED DESCRIPTION OF THE INVENTION

Figure 1:
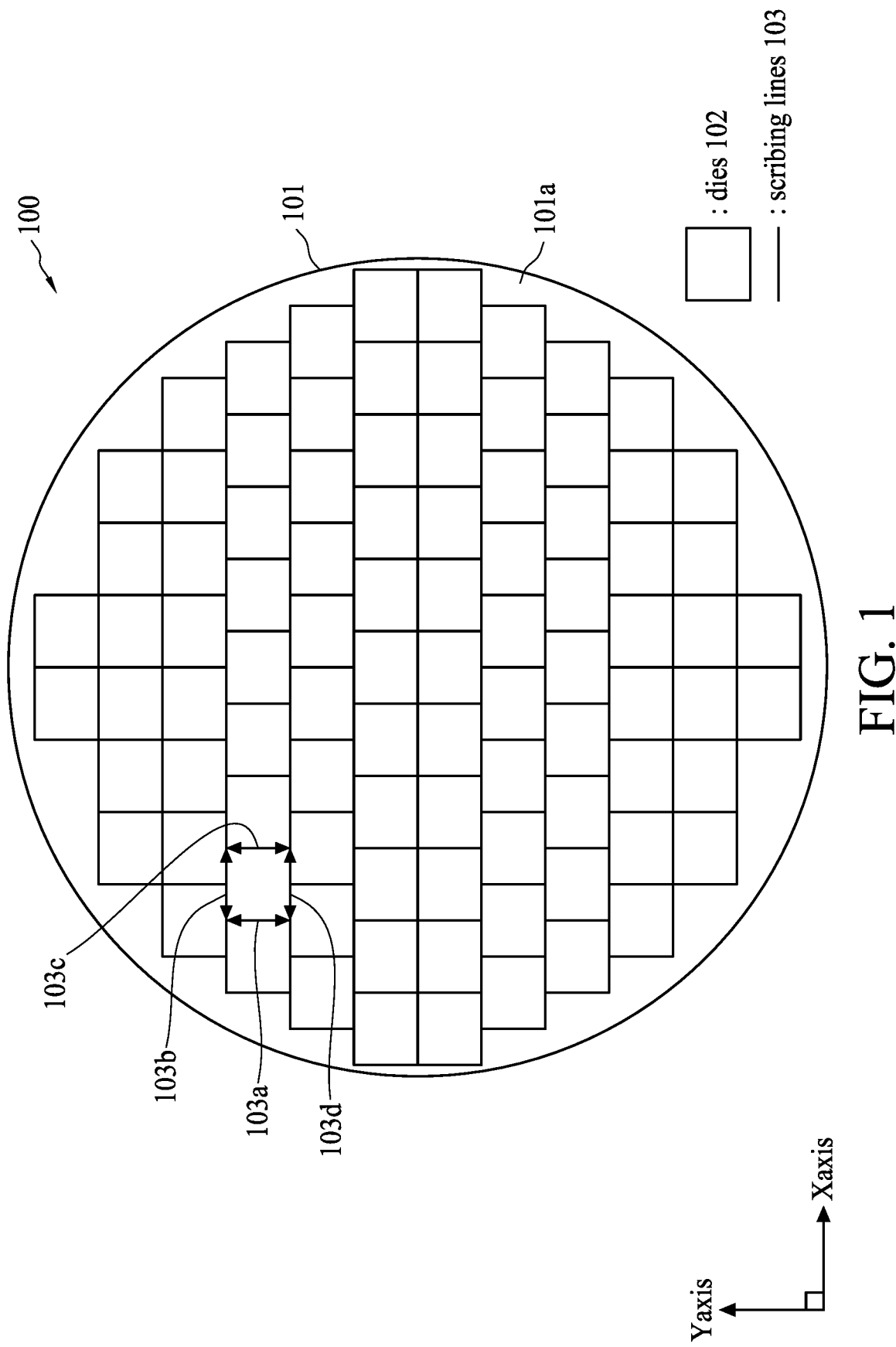
FIG. 1 is a schematic view of a semiconductor device in accordance with some embodiments of the present disclosure.

The carrier such as a semiconductor wafer is configured for carrying and supporting several dies. The carrier is divided by several scribing lines, and the dies are disposed on the carrier between the scribing lines. The dies have similar profile and dimension with each other. Each die is formed in a rectangle or a square on the carrier. The scribing lines are defined on a top surface of the carrier for facilitating die sawing operations. Each of the scribing lines is extended across the top surface of the carrier along either a horizontal direction or a vertical direction to form a regular matrix layout. The dies are aligned with each other in both horizontal and vertical directions to form rows and columns on the top surface of the carrier in accordance with the scribing lines. The dies are then singulated from the carrier by sawing along the scribing lines with a mechanical blade or etc.

However, the above arrangement of the dies and the scribing lines on the carrier have some issues such as formation of incomplete dies near an edge of the carrier, low space utilization, material wastage, etc. As the scribing lines and the dies are arranged in the regular matrix layout and the dies are in a rectangular or square shape while the carrier is in circular shape, the top surface area of the carrier could not be fully utilized for disposing the rectangular dies and thus a quantity of dies produced from each carrier is not in maximum. Therefore, some materials of the carrier are wasted and could not be used for producing complete dies and thus cause material wastage and higher material cost on each die.

The manufacturing and use of the embodiments of the present invention are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved configuration is disclosed. The semiconductor device includes a carrier and several dies disposed on the carrier in a staggered configuration in order to optimize the use of a surface area of the carrier and maximize a number of complete dies produced by the carrier.

FIG. 1 is an embodiment of a semiconductor device 100. The semiconductor device includes a carrier 101, several dies 102 disposed on a surface 101a of the carrier 101 and several scribing lines 103 defined on the surface 101a of the carrier 101. In some embodiments, the carrier 101 is a silicon wafer which would be fabricated to become integrated circuits (IC) in subsequent manufacturing operations. In some embodiments, the carrier 101 is a glass wafer which is bonded by silicon dies in wafer level package process. In some embodiments, the carrier 101 is a circuit board including some circuits for electrical connection of components thereon. In some embodiments, the circuit board is a printed circuit board (PCB). In some embodiments, the carrier 101 is in a circular shape as in FIG. 1.

In some embodiments as in FIG. 1, each of the dies 102 is a small piece including semiconductor materials such as silicon and is fabricated with a predetermined functional circuit within the die 102 produced by photolithography operations. In some embodiments, the dies 102 are attached on the surface 101a of the carrier 101 by an adhesive or a tape etc. In some embodiments, each of the dies 102 is in a quadrilateral, a rectangular or a square shape.

In some embodiments, each of the dies 102 is disposed on the surface 101a and surrounded by several scribing lines 103 as in FIG. 1. In some embodiments, each die 102 is surrounded by four portions (103a, 103b, 103c, 103d) of the scribing lines 103. In some embodiments, two portions (103a, 103c) of the four portions (103a, 103b, 103c, 103d) of the scribing lines 103 are in same dimension, and another two portions (103b, 103d) of the four portions (103a, 103b, 103c, 103d) of the scribing lines 103 are also in same dimension, so that each die 102 on the carrier 101 is configured in the quadrilateral or the rectangular shape as in FIG. 1. In some embodiments, a width of each of the scribing lines 103 is about 20 μm to about 60 μm. In some embodiments, the width of each of the scribing lines 103 is about 10 μm to about 80 μm.

In some embodiments, the scribing lines 103 include several continuous lines 103-1 along a first direction and several discontinuous lines 103-2 along a second direction. In some embodiments, the first direction is X axis and the second direction is Y axis. The scribing lines 103 includes several continuous lines 103-1 along X axis and several discontinuous lines 103-2 along Y axis as in FIG. 1A. The continuous line 103-1 is a straight line which is continuously extended across the carrier 101 from one end of the carrier 101 to another opposite end of the carrier 101 along the X axis. In some embodiments, the continuous line 103-1 is a line which is continuously and horizontally extended between a left side 101b of the carrier 101 and a right side 101c of the carrier.

Figure 1A:
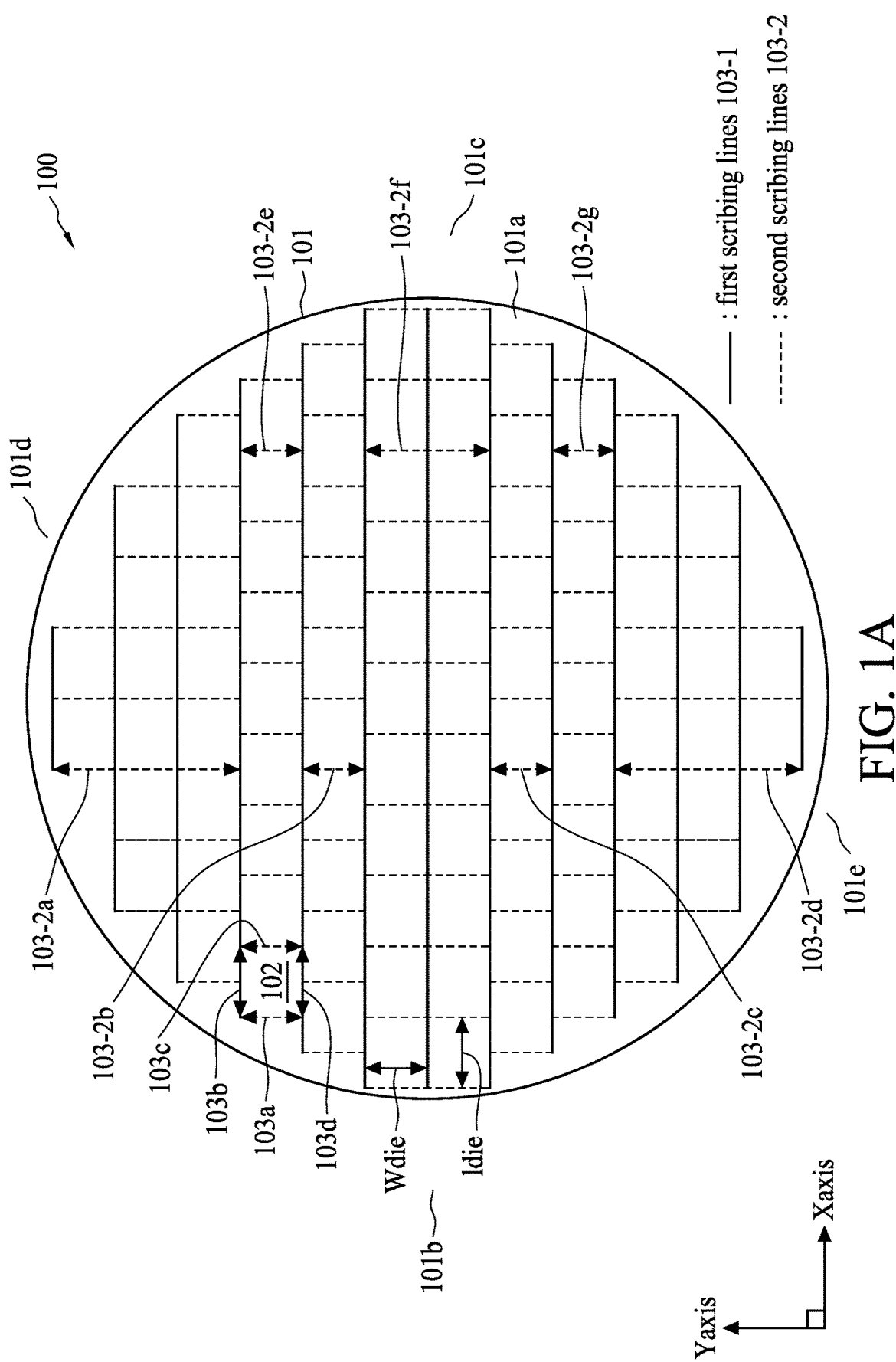
FIG. 1A is a schematic view of a semiconductor device including several dies arranged in several horizontal rows in accordance with some embodiments of the present disclosure.

In some embodiments, several continuous lines 103-1 are extended horizontally across the carrier 101 along the X axis as in FIG. 1A. The continuous lines 103-1 are parallel with each other horizontally. In some embodiments, the continuous lines 103-1 are spaced with each other in a same distance. In some embodiments, the distance between the continuous lines 103-1 is substantially the same as a first length $w_{die}$ of each of the dies 102. In some embodiments, the first length $w_{die}$ of the die 102 is a width of the die 102.

In some embodiments as in FIG. 1A, the discontinuous line 103-2 is a broken straight line extending from one end of the carrier 101 to another opposite end of the carrier 101 along the Y axis. Each of the discontinuous lines 103-2 includes several of straight line segments along the Y axis on the carrier 101. In some embodiments, a discontinuous line 103-2 includes four line segments (103-2a, 103-2b, 103-2c, 103-2d). In some embodiments, a discontinuous line 103-2 includes three line segments (103-2e, 103-2f, 103-2g). Each line segment is at least substantially equal to or greater than the first length $w_{die}$ of each of the dies 102. In some embodiments, the line segments 103-2f is two times of the first length $w_{die}$ of the die 102. In some embodiments, the line segments (103-2a, 103-2d) respectively are three times of the first length $w_{die}$ of the die 102.

In some embodiments, the discontinuous line 103-2 is a straight broken line which is extended between a top side 101d of the carrier 101 and a bottom side 101e of the carrier. In some embodiments, the discontinuous lines 103-2 are extended vertically along the Y axis. In some embodiments, the discontinuous lines 103-2 are spaced with each other in a same distance. In some embodiments, the distance between the discontinuous lines 103-2 is substantially the same as a second length $l_{die}$ of each of the dies 102.

In some embodiments as in FIG. 1A, at least two of the continuous lines 103-1 and at least two discontinuous lines 103-2 are in cooperation to divide the carrier 101 in a staggered or non-matrix layout. Thus, at least two of the continuous lines 103-1 and at least two discontinuous lines 103-2 are in cooperation to arrange the dies 102 on the surface 101a of the carrier 101 between the scribing lines 103 in the staggered layout. The dies 102 are aligned with each other in the X axis only, the dies 102 are not aligned with each other in the Y axis. In some embodiments, the dies 102 are arranged in several rows parallel to the first direction. In some embodiments, the dies 102 are aligned in several horizontal rows along the X axis as in FIG. 1A.

In some embodiments, a die 102 is surrounded by two portions (103b, 103d) of the continuous lines 103-1 and two portions (103a, 103c) of the discontinuous lines 103-2. In some embodiments, two respective portions (103b, 103d) of at least two of the continuous lines 103-1 and two respective portions (103a, 103c) of at least two of the discontinuous lines 103-2 are in cooperation to define a dimension of each die 102. The dimension of each die 102 includes a length $l_{die}$ and a width $w_{die}$. The two portions (103b, 103d) of the continuous lines 103-1 are respectively substantially equal to the length $l_{die}$ of the die 102, and the two portions (103a, 103c) of the discontinuous lines 103-2 are respectively substantially equal to the width $w_{die}$ of the die 102.

In some embodiments as in FIG. 1A, the X axis is orthogonal to the Y axis. The continuous lines 103-1 are orthogonal to the discontinuous lines 103-2. In some embodiments, the X axis is a horizontal direction while the Y axis is a vertical direction orthogonal to the X axis.

In some embodiments, the dies are arranged in several columns parallel to the second direction. As in FIG. 1B, several dies 102 are aligned with each other along the Y axis. The dies 102 are aligned with each other in several vertical columns. The dies 102 are aligned with each other in the Y axis only, while the dies 102 are not aligned with each other in the X axis.

Figure 1B:
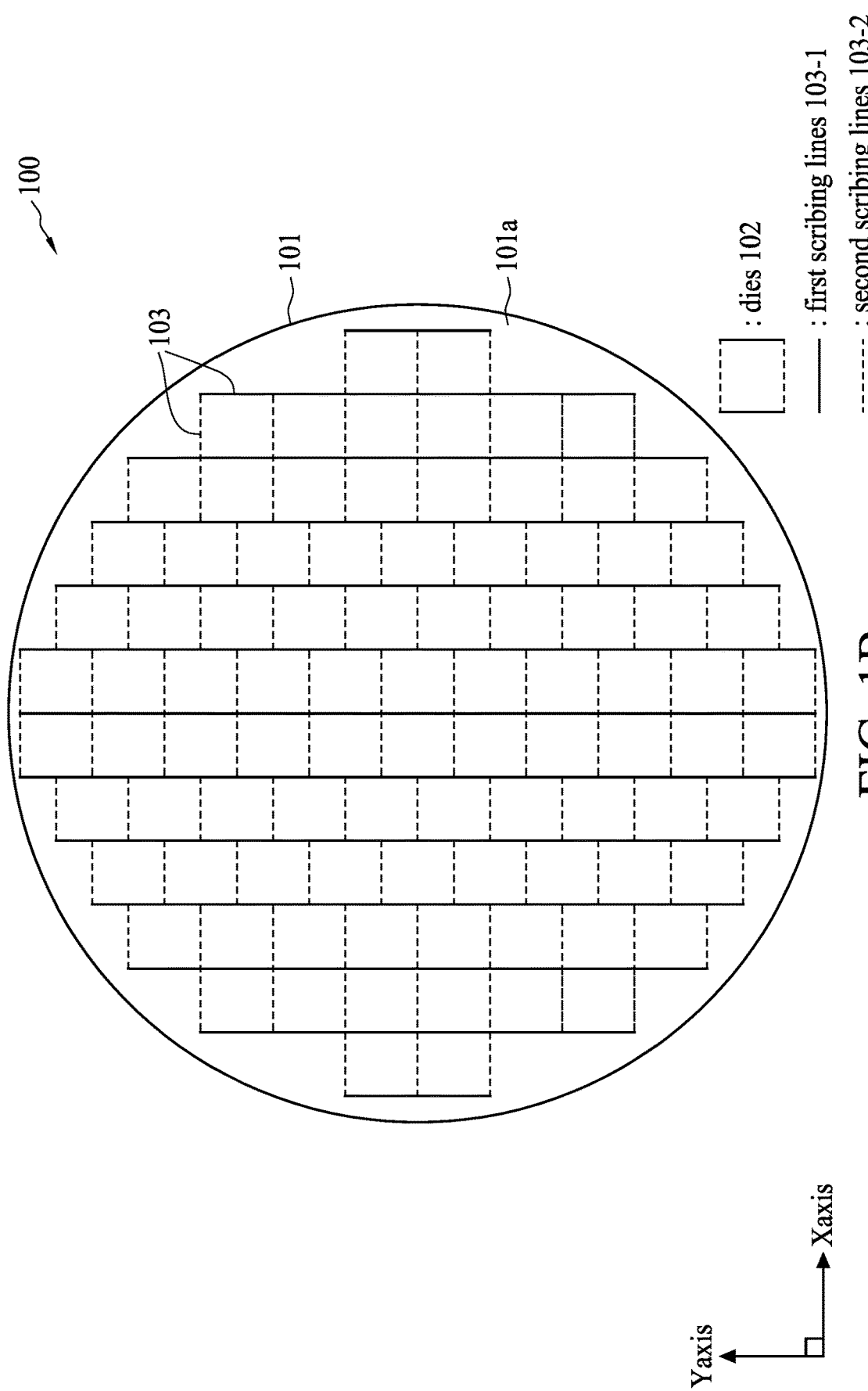
FIG. 1B is a schematic view of a semiconductor device including several dies arranged in several vertical columns in accordance with some embodiments of the present disclosure.

As in FIG. 1A and FIG. 1B, several scribing lines 103 including the continuous lines 103-1 and discontinuous lines 103-2 and the dies 102 arranged on the circular carrier 101 in staggered configuration would optimize the use of the surface area of the carrier 101 and maximize quantity of dies 102 produced by each carrier 101.

Figure 2:
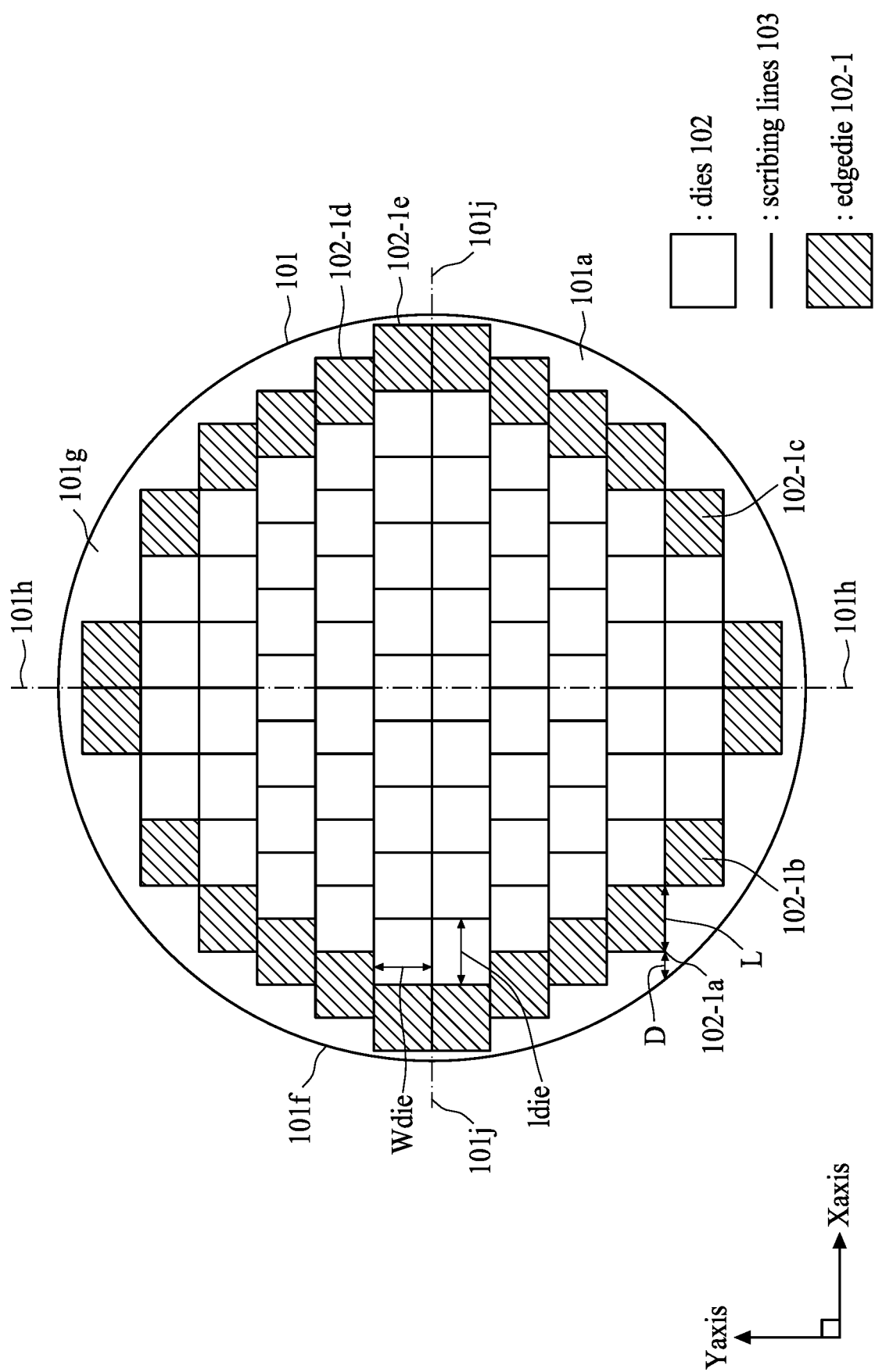
FIG. 2 is a schematic view of a semiconductor device including several dies arranged in a staggered configuration in accordance with some embodiments of the present disclosure.

FIG. 2 is an embodiment of a semiconductor device 100. The semiconductor device 100 includes a carrier 101, several dies 102 disposed on the carrier 101. The dies 102 are surrounded by an edge 101f of the carrier 101. The dies 102 include several edge dies 102-1 adjacent to a periphery 101g of the carrier 101. Each one of the edge dies 102-1 includes a longest length L and a corner 102-1a nearest to the edge 101f of the carrier 101. There is a shortest distance D between the edge 101f of the carrier 101 and the corner 102-1a of one of the edge dies 102-1. The shortest distance D is parallel to the longest length L and is substantially equal to or smaller than a half of the longest length L of each one of the edge dies 102-1.

In some embodiments, the carrier 101 is a silicon wafer in a circular shape. In some embodiments, several dies 102 disposed on the surface 101a of the carrier 101 are in a staggered configuration as in FIG. 2. The dies 102 are aligned in several horizontal rows along the X axis. Each die 102 is in rectangular shape and has a dimension of a length $l_{die}$ and a width $w_{die}$. In some embodiments, the dies 102 are symmetrically arranged on the carrier 101 about a central vertical axis 101h of the carrier 101 and/or a central horizontal axis 101j of the carrier 101.

In some embodiments, there are several edge dies 102-1 disposed adjacent to the periphery 101g of the carrier 101. In some embodiments, the edge dies 102-1 are in cooperation to configure in an enclosure so that the edge dies 102-1 surround the rest of the dies 102. Each of the edge dies 102-1 is disposed at either one end of each horizontal row of the dies 102. For example, the edge die 102-1b is opposite to another corresponding edge die 102-1c in a same horizontal row.

In some embodiments as in FIG. 2, each edge die 102-1 has four sides. The edge die 102-1 has the longest length L which is the longest among the four sides of the edge die 102-1. In some embodiments, each edge die 102-1 has four points for respectively coupling with two of the four sides. The edge die 102-1 has the corner 102-1a which is nearest to the edge 101f of the carrier 101 among the four points.

In some embodiments, there is a shortest distance D between the edge 101f and the corner 102-1a. The shortest distance D is parallel to the longest length L of the edge die 102-1. In some embodiments, the shortest distance D is substantially equal to or smaller than a half of the longest length L, so that the dies 102 are in an optimized staggered layout and thus the surface area of the carrier is fully utilized in order to minimize a quantity of incomplete dies adjacent to the periphery 101g of the carrier 101 and wastage of materials and optimize the use of the carrier 101. For example, if each of the dies 102 has a length $l_{die}$ of 26 mm and a width $w_{die}$ of 24 mm, the longest length L is the length of 26 mm, and thus the shortest distance D between the edge 101f and the corner 102-1a of the edge die 102-1 is equal to or less than about 13 mm which is a half of the length of 26 mm.

FIG. 3 is a table tabulated the maximum number of dies supported by a carrier with a diameter of twelve inches based upon the above optimized configuration as in FIGS. 1, 1A and 1B. For example, if the die is a square with a length of 22 mm, six more dies can be disposed on the surface of the carrier when the dies are disposed in the optimized layout such as a staggered configuration.

When the size of the die 102 is greater than a threshold value, the number of dies 102 produced by the carrier 101 in the staggered configuration is apparently increased. In some embodiments, when the size of the die 102 is greater than 10 mm×10 mm, an increment of number of dies 102 produced by the carrier 101 is more obvious which is more than 2%. In some embodiments, when a length $l_{die}$ of the die 102 is greater than a first threshold value and a width $w_{die}$ of the die is greater than a second threshold value, the number of dies 102 produced by the carrier 101 in the staggered configuration is apparently increased. In some embodiments, when the length $l_{the}$ of the die 102 is greater than 15 mm and the width $w_{die}$ of the die 102 is greater than 10 mm, the increment of number of dies 102 produced by the carrier 101 is more obvious which is more than 2%.

In the present disclosure, a method of manufacturing a semiconductor device is also disclosed. In some embodiments, a semiconductor device is formed by a method 200, a method 300 or a method 400. The description and illustration are not deemed as a limitation as the sequence of the operations.

Figure 4:
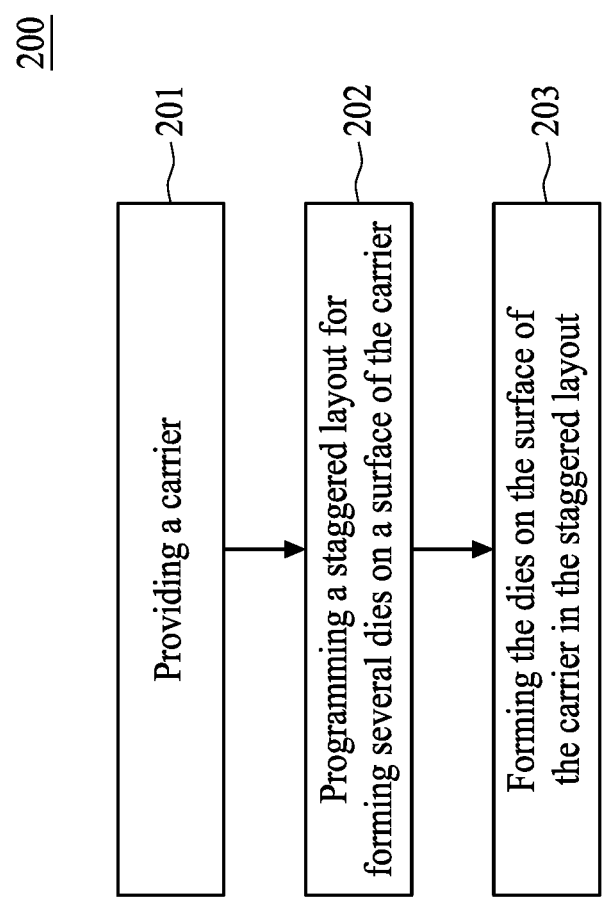
FIG. 4 is a flow diagram of a method of manufacturing a semiconductor device in accordance with some embodiments of the present disclosure.

FIG. 4 is an embodiment of a method 200 of manufacturing a semiconductor device. The method 200 includes several operations (201, 202, 203).

Figure 4B:
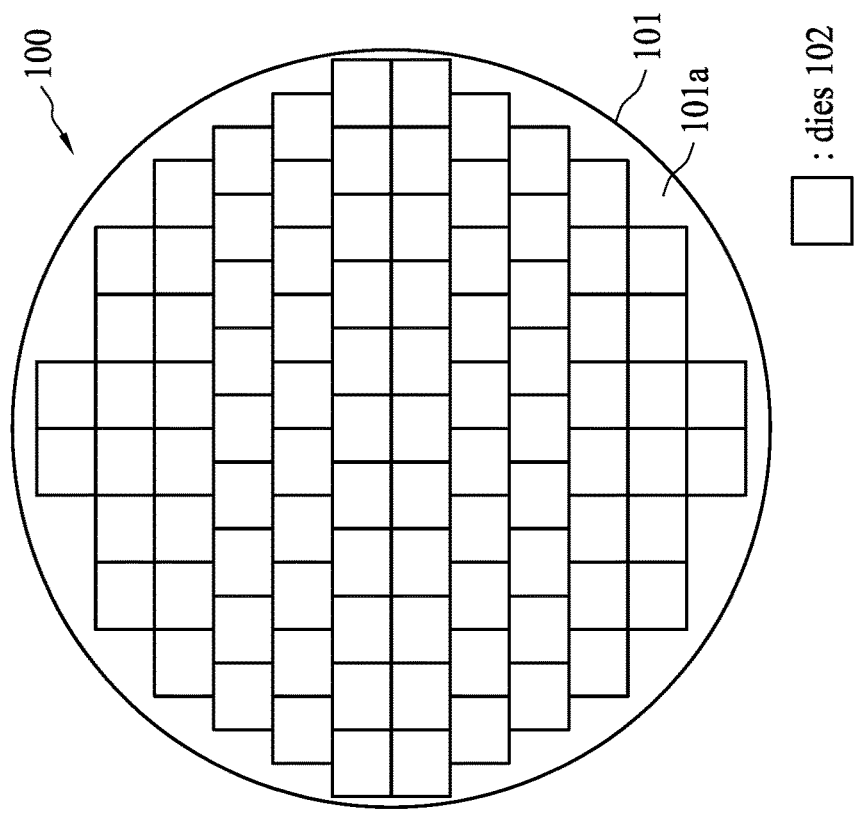
FIG. 4B is a schematic view of a semiconductor device including several dies in a staggered or non-matrix layout in accordance with some embodiments of the present disclosure.
Figure 4A:
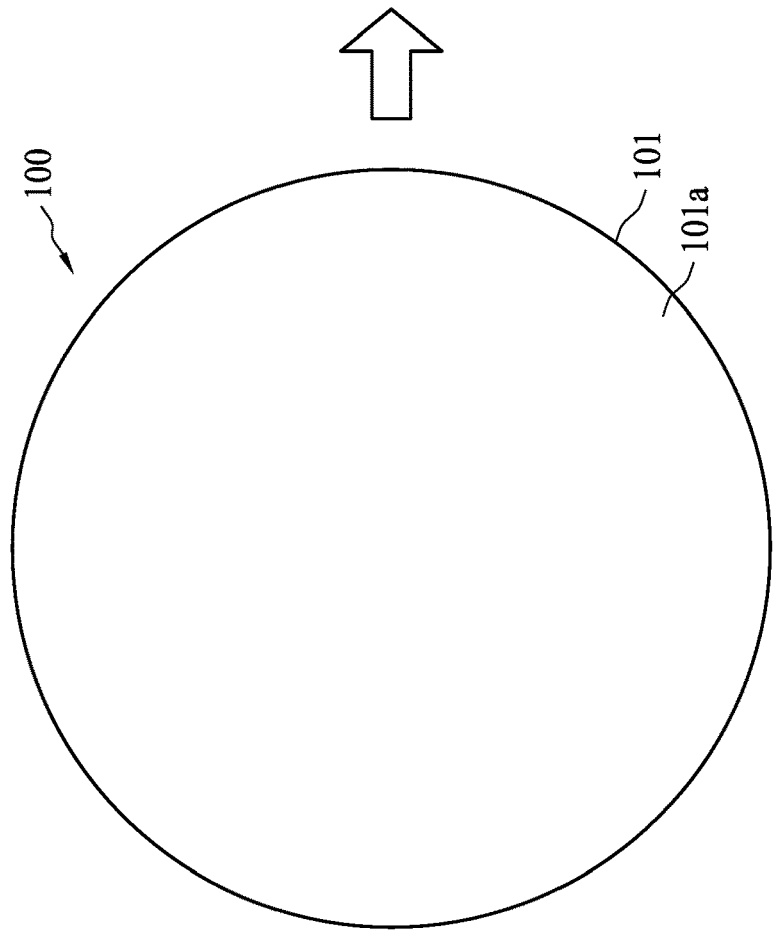
FIG. 4A is a schematic view of a semiconductor device for forming several dies in accordance with some embodiments of the present disclosure.

In operation 201, a carrier 101 is provided as in FIG. 4A. The carrier 101 is configured for forming several dies on a surface 101a of the carrier.

In operation 202, a staggered layout of the dies 102 as in FIG. 4B is designed for forming several dies 102 on the surface 101 of the carrier 101. In some embodiments, the staggered layout of the dies 102 is programmed such that several dies 102 are controlled to be formed in the staggered layout accordingly on the surface 101a of the carrier 101 within a predetermined duration of time.

In operation 203, the dies 102 are formed on the surface 101a of the carrier 101 in the staggered layout as in FIG. 4B. The dies 102 are then disposed on the carrier 101 and configured in the staggered layout, so that the carrier 101 carries more number of dies 102 and thus the use of the surface area of the carrier 101 is optimized.

Figure 5:
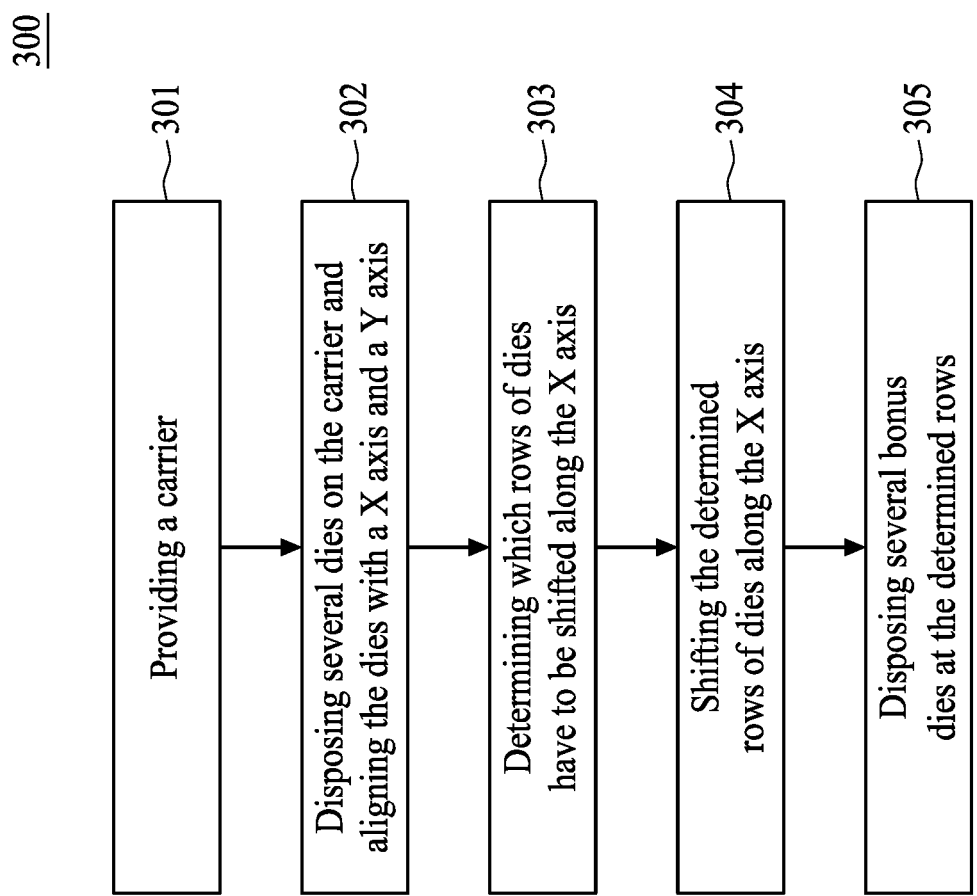
FIG. 5 is a flow diagram of a method of manufacturing a semiconductor device in accordance with some embodiments of the present disclosure.

FIG. 5 is an embodiment of a method 300 of manufacturing a semiconductor device. The method 300 includes several operations (301, 302, 303, 304, 305).

In operation 301, a carrier is provided. In some embodiments, the carrier 101 is a silicon wafer in a circular shape as in FIG. 5A. In operation 302, several dies are disposed on a surface of the carrier and are aligned in X axis and Y axis. In some embodiments as in FIG. 5A, several dies 102 are disposed on the surface 101a of the carrier 101. The dies 102 are aligned with each other in the X axis and the Y axis. In some embodiments, the dies 102 are disposed in several rows horizontally along the X axis and several columns vertically along the Y axis, so that the dies 102 are configured in a regular matrix or chessboard layout as in FIG. 5A.

As some surface areas adjacent to a periphery 101g of the carrier 101 have not been utilized for disposing the dies 102 based on the chessboard layout, some horizontal rows of the dies 102 have to be shifted along the X axis, so that more dies 102 can be held by the carrier 101 and the use of the surface area of the carrier 101 would be optimized.

In operation 303, some horizontal rows of the dies 102 would be determined as requiring shifting along the X axis. In some embodiments, one or more rows of the dies 102 would be determined as requiring shifting if a shortest distance D parallel to the longest length $l_{die}$ of the die 102 between the die 102 disposed at an end of the row of the dies 102 and an edge 101f of the carrier 101 is substantially larger than a half of the longest length $l_{die}$. As in FIG. 5A, the shortest distance D of a second, third, fifth, eighth, tenth, eleventh and twelfth rows of the dies 102 are larger than a half of the longest length $l_{die}$ of the die 102, and thus these seven rows of the dies 102 are required to be shifted along the X axis.

Figures 5A, 5B:
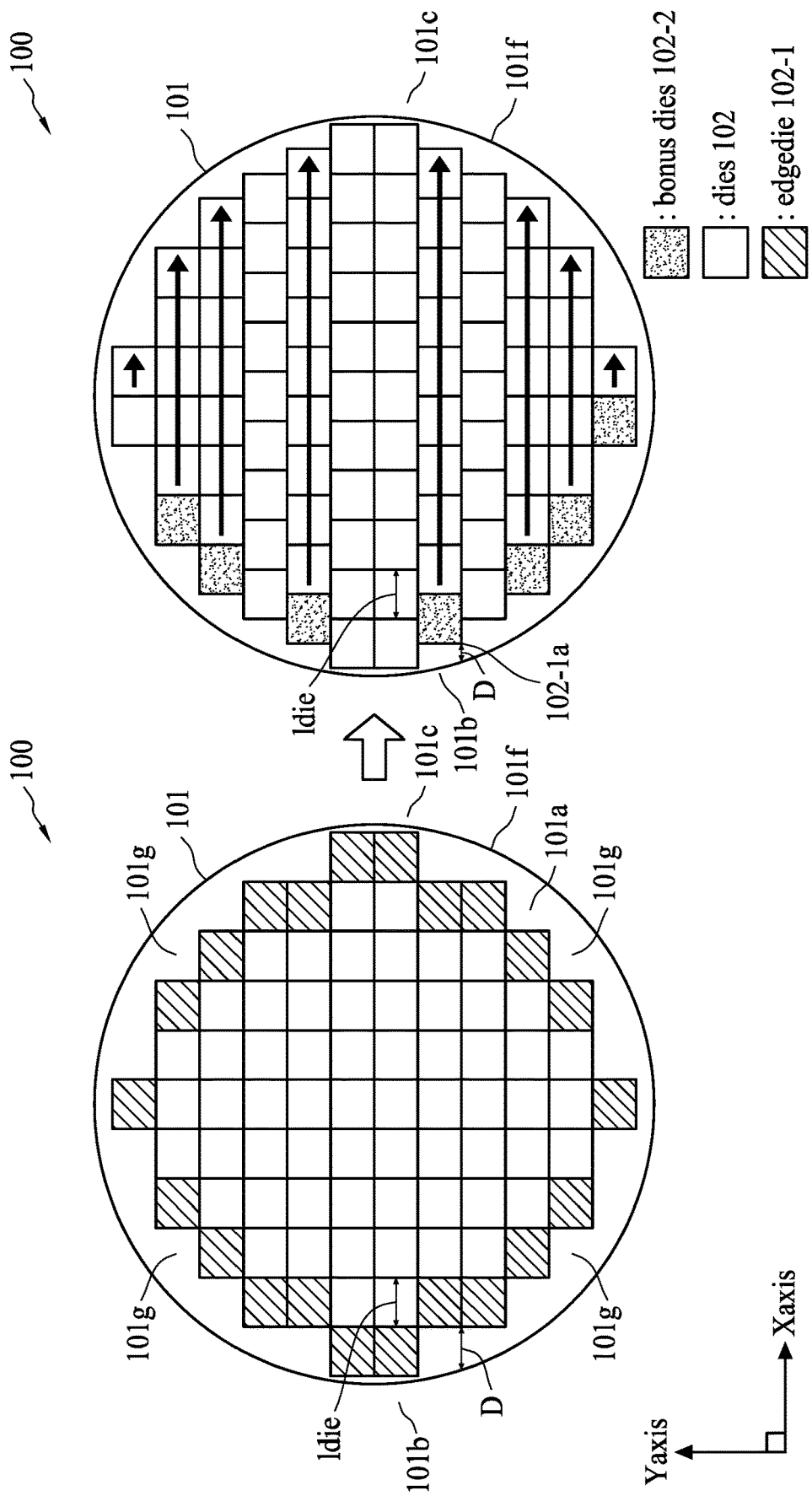
FIG. 5A is a schematic view of a semiconductor device in a regular matrix or a chessboard layout in accordance with some embodiments of the present disclosure.
FIG. 5B is a schematic view of a semiconductor device in a staggered or non-matrix layout in accordance with some embodiments of the present disclosure.

In operation 304, the rows of the dies 102 being determined in the operation 303 are shifted along the X axis as in FIG. 5B. In some embodiments, the rows of the dies 102 being determined are shifted towards a right side 101c of the carrier 101, so that the dies 102 disposed adjacent to the right side 101c of the periphery 101g are getting closer to the edge 101f of the carrier 101 in order to empty some surface areas of the carrier 101 adjacent to a left side 101b of the periphery 101g for adding more number of dies 102.

In operation 305, several additional bonus dies 102-2 are disposed on the surface 101a of the carrier 101. In some embodiments, the bonus dies 102-2 are disposed at one end of each shifted row adjacent to the periphery 101g of the carrier 101. In some embodiments as in FIG. 5B, seven horizontal rows of the dies 102 are shifted towards the right side 101c. The dies 102 on the carrier 101 are then configured to be in a staggered or non-matrix layout. Seven bonus dies 102-2 are additionally disposed on the carrier 101 as in FIG. 5B compared with the dies 102 configured in the chessboard layout on the carrier 101 as in FIG. 5A.

In some embodiments, the die 102 at one end of each row has a shortest distance D parallel to the longest length $l_{the}$ of the die 102 between the edge 101f of the carrier 101 and a corner 102-1a of the die 102 nearest to the edge 101f. The shortest distance D is substantially equal to or less than a half of a longest length $l_{die}$ of the die 102.

Figure 6:
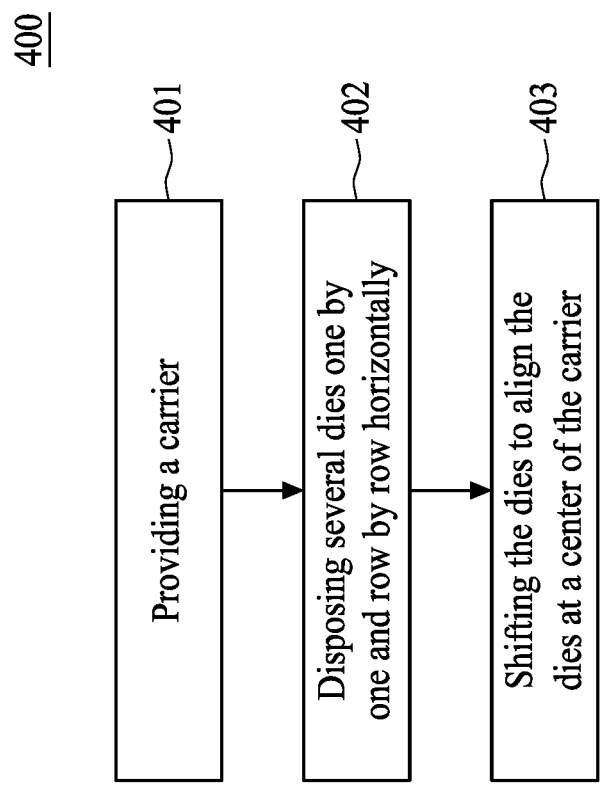
FIG. 6 is a flow diagram of a method of manufacturing a semiconductor device in accordance with some embodiments of the present disclosure.

FIG. 6 is an embodiment of a method 400 of manufacturing a semiconductor device. The method 400 includes several operations (401, 402, 403).

In operation 401, a carrier is provided. In operation 402, several dies 102 are disposed on a surface 101a of the carrier 101 as in FIG. 6A. In some embodiments, the dies 102 are disposed by row along X axis. Several edge dies 102-1 of the dies 102 are first disposed on the carrier 101 adjacent to a bottom side 101e and a left side 101b of the carrier 101. Each of the edge dies 102-1 has a corner 102-1a contacting an edge 101f of the carrier 101. Other dies 102 are then disposed following the former one of the dies 102 to form a first row along the X axis.

When the surface area adjacent to the bottom side 101e and a right side 101c of the carrier 101 is insufficient for disposing the die 102, the die 102 is then disposed adjacent to the bottom side 101e and the left side 101b of the carrier 101 to start a new second row along the X axis. The rest of the dies 102 are disposed accordingly from the left side 101b to the right side 101c and from the bottom side 101e to the top side 101d of the carrier 101 as in FIG. 6A, until the dies 102 are then filled up most of the surface area of the carrier 101 in a staggered configuration as in FIG. 6B.

In operation 403, each row of the dies 102 is shifted along the X axis in order to center the dies 102 as a whole within the carrier 101 as in FIG. 6C. Each row of the dies 102 is shifted horizontally along the X axis to dispose the dies 102 as a whole at a center of the carrier 101. In some embodiments, each row of the dies 102 is shifted such that a shortest distance D1 between the edge 101f of the carrier 101 and the corner 102-1a of a edge die 102-1b disposed at an end of the row is substantially equal to a shortest distance D2 between the edge 101f and the corner 102-1a of another edge die 102-1c disposed at an opposite end of the same row.

In some embodiments, the shortest distances (D1, D2) of each row of the dies 102 are consistent, so that the row is symmetrical about a central vertical axis 101h of the carrier 101 and/or a central horizontal axis 101j of the carrier 101. In some embodiments as in FIG. 6C, all dies 102 as a whole are symmetrical about a central vertical axis 101h of the carrier 101 and/or a central horizontal axis 101j of the carrier 101.

In the present disclosure, a method of singulating several dies from a carrier is also disclosed. In some embodiments, the dies are singulated from the carrier by a method 500. The description and illustration are not deemed as a limitation as the sequence of the operations.

Figure 7:
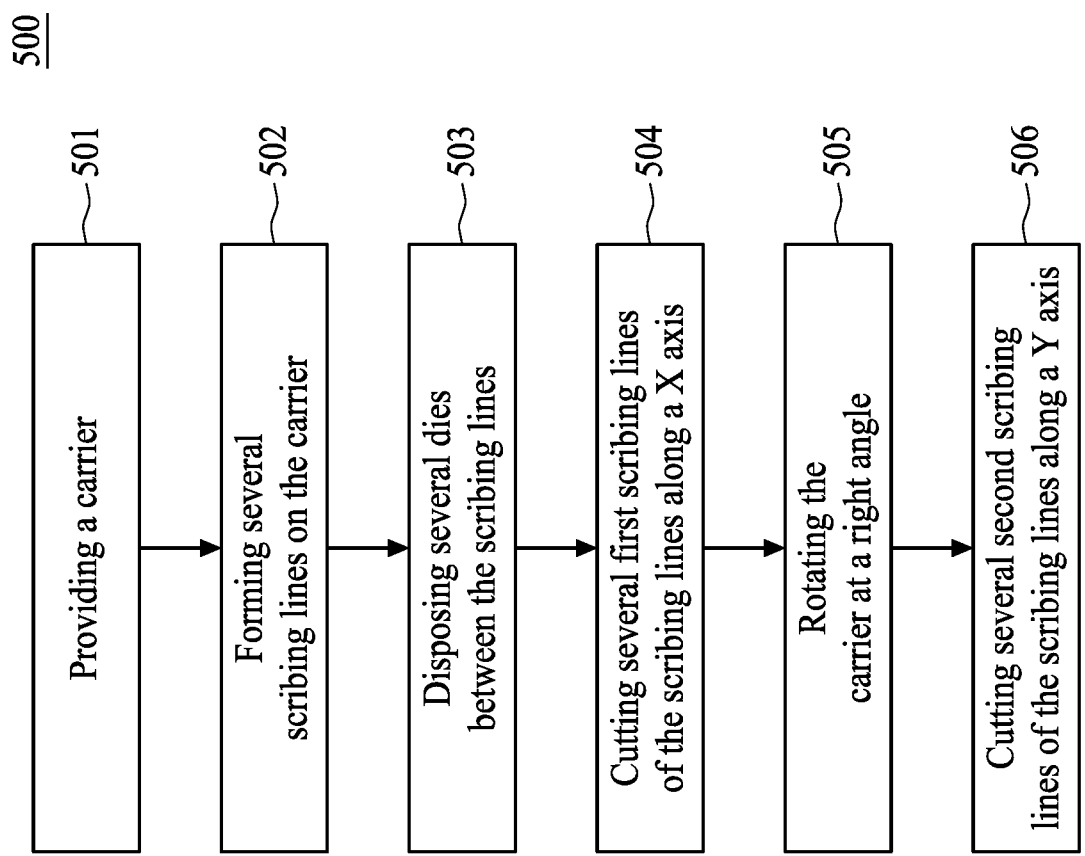
FIG. 7 is a flow diagram of a method of manufacturing a semiconductor device in accordance with some embodiments of the present disclosure.

FIG. 7 is an embodiment of a method 500 of singulating several dies from a carrier. The method 500 includes several operations (501, 502, 503, 504, 505, 506).

Figure 7A:
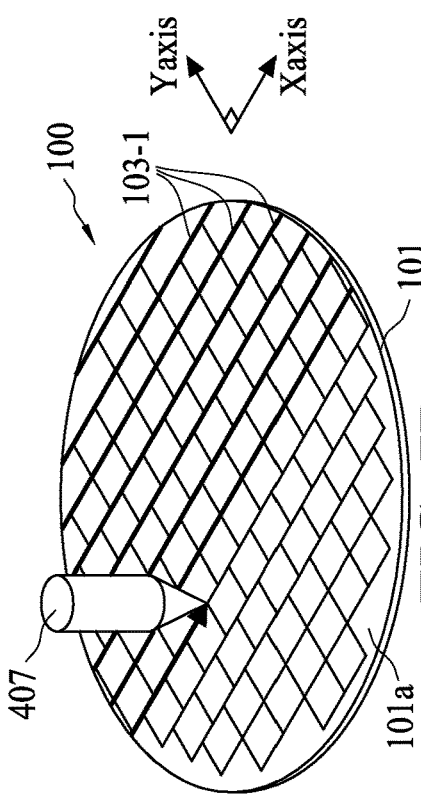
FIG. 7A is a schematic view of a semiconductor device disposed with several dies in a staggered configuration in accordance with some embodiments of the present disclosure.

In operation 501, a carrier is provided. In operation 502, several scribing lines are formed on the carrier. As in FIG. 7A, several scribing lines 103 are formed on a surface 101a of the carrier 101. In some embodiments, the scribing lines 103 are formed in a staggered configuration with reference to FIG. 1A or FIG. 1B. The scribing lines 103 include several continuous lines 103-1 along X axis and several discontinuous lines 103-2 along a Y axis. In some embodiments, the X axis is orthogonal to the Y axis, and thus the continuous lines 103-1 are also orthogonal to the discontinuous lines 103-2.

In operation 503, several dies are disposed on the surface of the carrier between the scribing lines including the continuous lines along the X axis and the discontinuous lines along the Y axis. In some embodiments as in FIG. 7A, the dies 102 are disposed between the scribing lines 103. Each die 102 is surrounded by at least four portions of the scribing lines 103. The dies 102 are disposed in the staggered configuration according to the scribing lines 103.

Figure 7B:
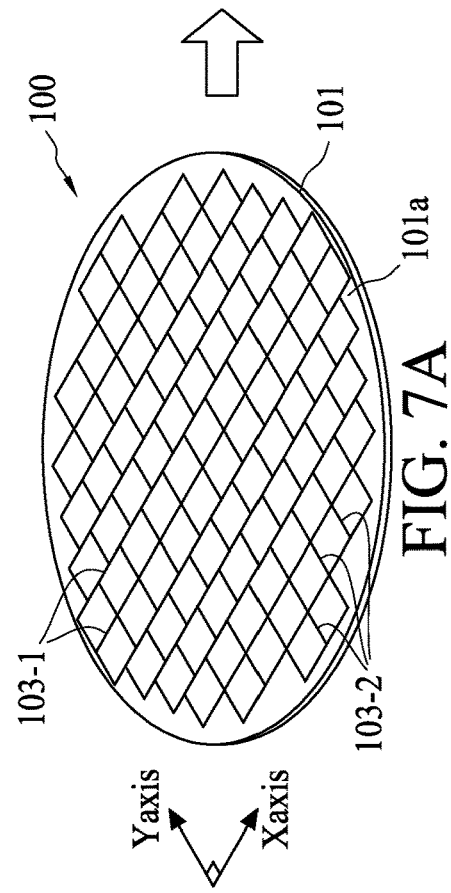
FIG. 7B is a schematic view of a semiconductor device cut by a cutting member along a X axis in accordance with some embodiments of the present disclosure.

In operation 504, the carrier 101 is cut according to several continuous lines along the X axis. As in FIG. 7B, the continuous lines 103-1 of the scribing lines 103 are cut along the X axis by a cutting member 407. The cutting member 407 is continuously passed over the surface 101a of the carrier 101 to cut the carrier 101 following the continuous lines 103-1 from one side of the carrier 101 to another opposite side of the carrier 101.

In some embodiments, the cutting member 407 includes a laser beam for cutting the carrier 101. In some embodiments, the laser beam cuts the carrier 101 in a width of about 20 µm. In some embodiments, the cutting member 407 is a pulsed Nd:YAG laser blade in a wavelength of 355 nm, 532 nm or 1064 nm with a power of about 1 to about 100 Watt (W). In some embodiments, the cutting member 407 cuts the carrier 101 in a speed of about 50 mm/s to about 300 mm/s.

Figure 7C:
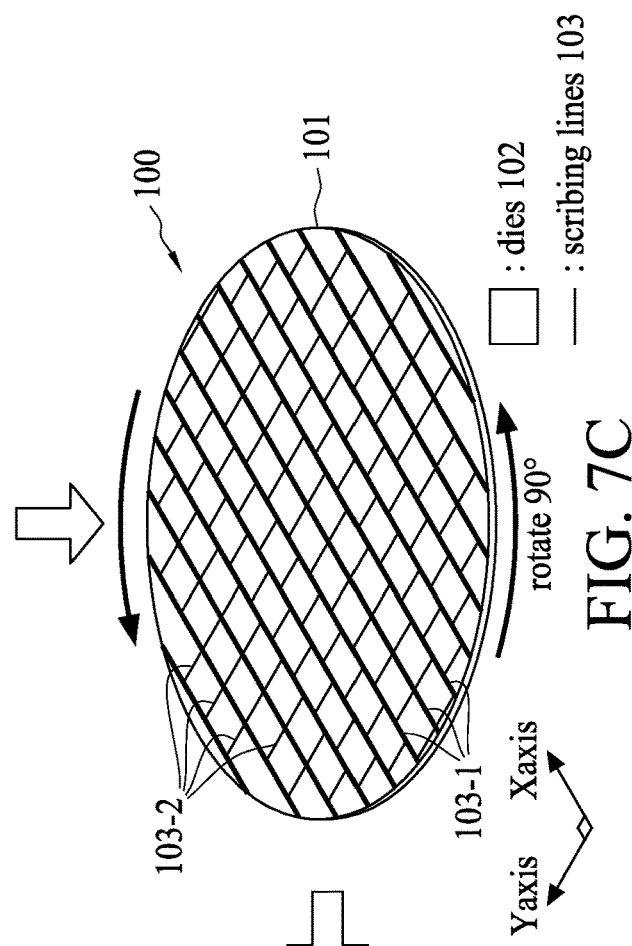
FIG. 7C is a schematic view of a semiconductor device rotated at a right angle relative to a X axis in accordance with some embodiments of the present disclosure.

In operation 505, the carrier is rotated at about a right angle relative to the X axis. As in FIG. 7C, the carrier 101 is rotated at a right angle in either a clockwise or an anti-clockwise direction. In some embodiments, the carrier 101 is rotated at an angle of 270 degree.

Figure 7D:
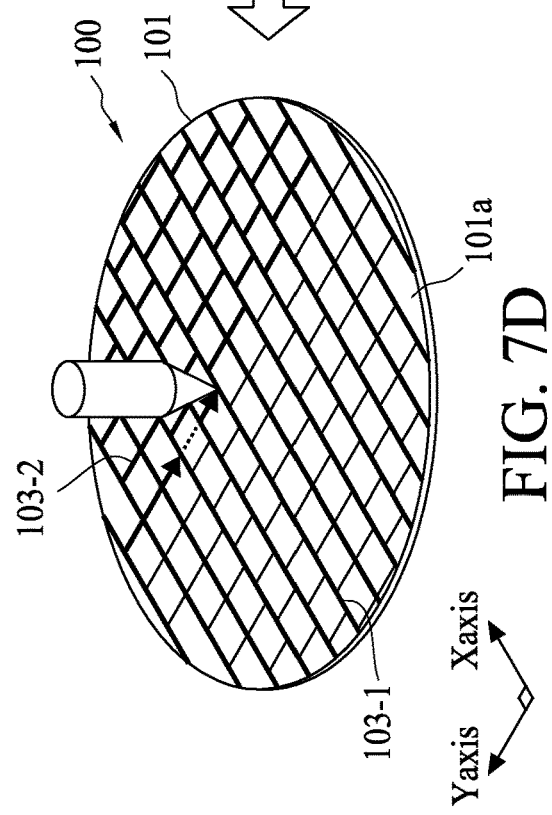
FIG. 7D is a schematic view of a semiconductor device cut by a cutting member along a Y axis in accordance with some embodiments of the present disclosure.

In operation 506, the carrier is cut according to several discontinuous lines along a Y axis. As in FIG. 7D, the carrier 101 is cut by the cutting member 407 according to the discontinuous lines 103-2. In some embodiments, the cutting member 407 passes over the surface 101a of the carrier 101 from one side of the carrier 101 to another opposite side of the carrier 101 to cut the carrier 101 discontinuously by turning the cutting member 407 on and off alternately.

In some embodiments, when the cutting member 407 passes through the surface 101a of the carrier 101 along the Y axis where the discontinuous lines 103-2 of the scribing lines 103 are absent on the surface 101a of the carrier 101, the cutting member 407 turns off by turning on a shutter so that the carrier 101 would not be cut by the cutting member 407 temporarily.

Figure 8:
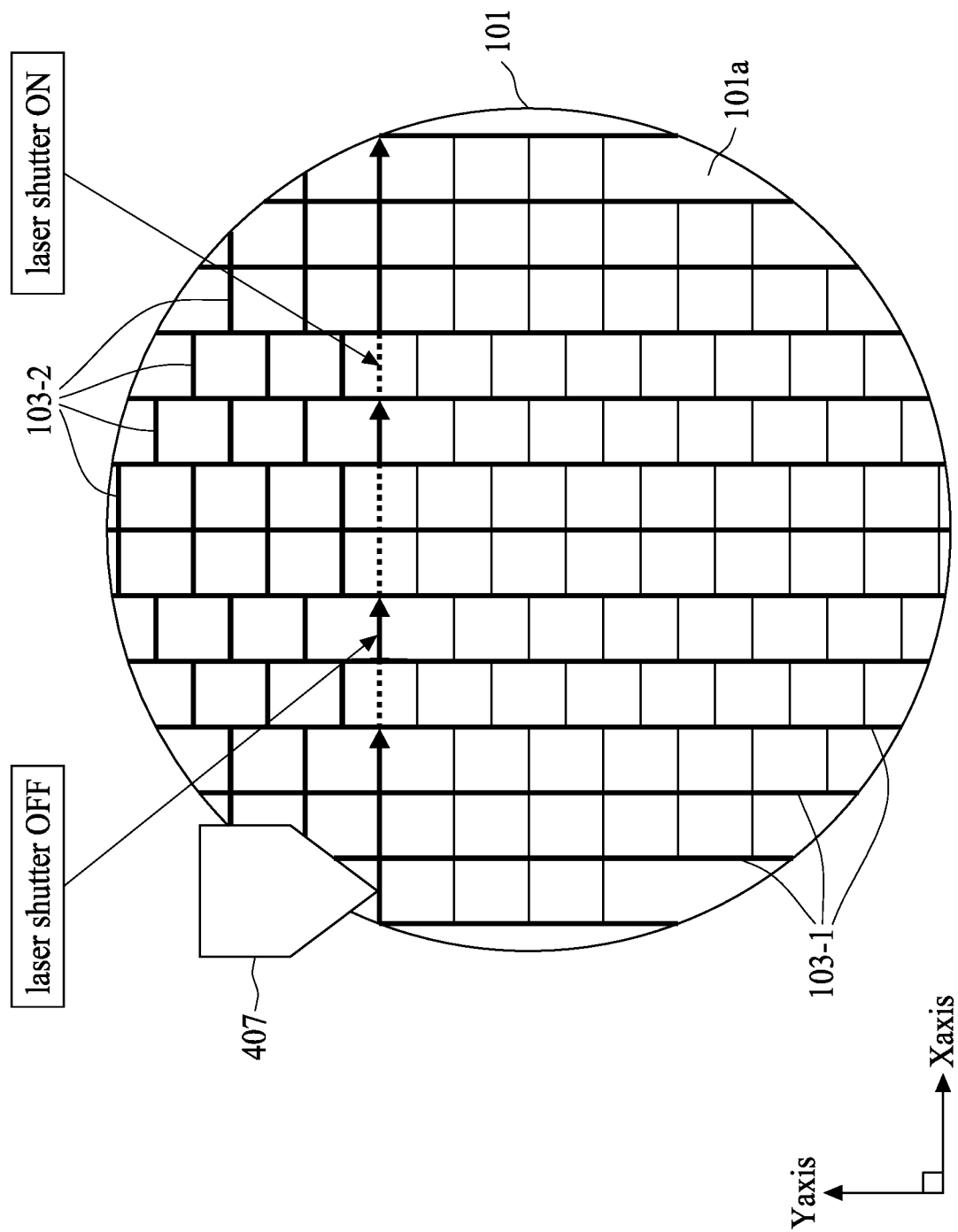
FIG. 8 is a schematic view of a semiconductor device cut by a cutting member including a shutter in accordance with some embodiments of the present disclosure.

In some embodiments, cutting of the carrier 101 is performed by a laser beam. In some embodiments as in FIG. 8, the cutting member 407 includes a laser beam, and the laser beam passes over the surface 101a of the carrier 101 for cutting the carrier 101. The laser beam turns on by turning off the shutter when the cutting member 407 passes over the discontinuous lines 103-2 of the scribing lines 103. The laser beam turns off by turning on the shutter when the cutting member 407 has not passed over any discontinuous lines 103-2 of the scribing line 103. The laser beam turns on and off alternately according to the present of the discontinuous lines 103-2 of the scribing lines 103 on the surface 101a of the carrier 101, such that the dies 102 are singulated out from the carrier 101 which is disposed with the dies 102 in the staggered configuration or the non-matrix layout according to the scribing lines 103.

In some embodiments, a semiconductor device is provided. The semiconductor device includes a carrier having a first central axis extending along a first direction and a second central axis extending along a second direction, a plurality of dies disposed on a surface of the carrier, and a plurality of scribing lines separating the plurality of dies from each other. In some embodiments, the plurality of scribing lines include a plurality of continuous lines along the first direction and a plurality of discontinuous lines along the second direction, at least one of the plurality of continuous lines overlaps the first central axis, at least one of the plurality of discontinuous lines overlaps the second central axis. In some embodiments, the plurality of dies are symmetrically arranged on the carrier about the first central axis and the second central axis.

In some embodiments, a shortest distance between an edge of the carrier and one of the plurality of discontinuous lines disposed adjacent to the edge of the carrier is substantially equal to or smaller than a half of a length of one of plurality of dies along the second direction. In some embodiments, the first direction is substantially orthogonal to the second direction. In some embodiments, each one of the plurality of dies is surrounded by at least two of the plurality of continuous lines and at least two of the plurality of discontinuous lines. In some embodiments, the plurality of dies are arranged in a plurality of row parallel to the first direction. In some embodiments, each one of the plurality of dies is in a quadrilateral shape. In some embodiments, the one of the plurality of continuous lines overlapping the first central axis is the longest continuous line.

In some embodiments, a method for manufacturing a semiconductor device is provided. The method includes the following operations. A carrier is provided. A plurality of die regions are defined over the carrier along a first direction and a second direction arranged the plurality of die regions in a plurality of rows and a plurality of columns. In some embodiments, each of the die region has a first side parallel to the first direction and a second side parallel to the second direction. A row is identified when a shortest distance between an edge of the carrier and the second side of a die region disposed at an end of the row is larger than a half of a length of the first side. The row is shifter along the first direction in a predetermined distance. An additional die region at an end of the shifter row. A die is formed in each of the plurality of die regions and the additional die region.

In some embodiments, the plurality of die regions and the additional die region ha have similar dimension. A shortest distance between an edge of the carrier and a corner of the additional die region is substantially equal to or smaller than a half of a length of the first side of the die region. In some embodiments, the first direction is substantially orthogonal to the second direction. In some embodiments, the plurality of die regions are separated from each other by a plurality of scribing lines. In some embodiments, the plurality of scribing lines include a plurality of continuous lines along the first direction and a plurality of continuous lines along the second direction before the shifting of the row. In some embodiments, the plurality of scribing lines include a plurality of discontinuous lines along the second direction after the shifting of the row. In some embodiments, at least one of the plurality of continuous lines overlaps a first central axis of the carrier, at least one of the plurality of discontinuous lines overlaps a second central axis of the carrier, and the plurality of dies are symmetrically arranged on the carrier about the first central axis and the second central axis.

In some embodiments, a method of manufacturing a semiconductor device is provided. The method includes the following operations. A carrier is provided. A plurality of die regions are defined over the carrier along a first direction to arrange to the plurality of die regions in a plurality of rows. In some embodiments, each of the plurality of rows has an edge die region having a corner contacting an edge of the carrier. Each of the plurality of rows is shifter along the first direction in a predetermined distance. A die is disposed in each of the plurality of die regions.

In some embodiments, a shortest distance between the edge of the carrier and the corner of the edge die region is greater than 0 and substantially equal to or smaller than a half of a length of the die region after the shifting of each of the plurality of rows. In some embodiments, the plurality of die regions are separated from each other by a plurality of scribing lines, and the plurality of scribing lines include a plurality of continuous lines along the first direction and a plurality of discontinuous lines along the a second direction. In some embodiments, the first direction is substantially orthogonal to the second direction. In some embodiments, at least one of the plurality of continuous lines overlaps a first central axis of the carrier, at least one of the plurality of discontinuous lines overlaps a second central axis of the carrier, and the plurality of dies are symmetrically arranged on the carrier about the first central axis and the second central axis.

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:

1. A method for manufacturing a semiconductor device, comprising:
    providing a carrier;
    defining a plurality of die regions over the carrier along a first direction and a second direction to arrange the plurality of die regions in a plurality of rows and a plurality of columns, wherein each of the die regions has a first side parallel to the first direction and a second side parallel to the second direction;
    identifying a row when a shortest distance between an edge of the carrier and the second side of a die region disposed at an end of the row is larger than a half of a length of the first side;
    shifting the row along the first direction in a predetermined distance;
    disposing an additional die region at an end of the shifted row; and
    forming a die in each of the plurality of die regions and the additional die region.

2. The method of claim 1, wherein the plurality of die regions and the additional die region have similar dimension.

3. The method of claim 1, wherein a shortest distance between an edge of the carrier and a corner of the additional die region is substantially equal to or smaller than a half of a length of the first side of the die region.

4. The method of claim 1, wherein the first direction is substantially orthogonal to the second direction.

5. The method of claim 1, wherein the plurality of die regions are separated from each other by a plurality of scribing lines.

6. The method of claim 5, wherein the plurality of scribing lines include a plurality of continuous lines along the first direction and a plurality of continuous lines along the second direction before the shifting of the row.

7. The method of claim 6, wherein the plurality of scribing lines include a plurality of discontinuous lines along the second direction after the shifting of the row.

8. The method of claim 7, wherein at least one of the plurality of continuous lines overlaps a first central axis of the carrier, at least one of the plurality of discontinuous lines overlaps a second central axis of the carrier, and the plurality of dies are symmetrically arranged on the carrier about the first central axis and the second central axis.

9. A method for manufacturing a semiconductor device, comprising:
    providing a carrier;
    defining a plurality of die regions over the carrier along a first direction to arrange the plurality of die regions in a plurality of rows, wherein each of the plurality of rows has an edge die region having a corner contacting an edge of the carrier;
    shifting each of the plurality of rows along the first direction in a predetermined distance, wherein all of the die regions are within the carrier after the shifting of each of the plurality of rows, and each of the edge die region is entirely within the carrier after the shifting of each of the plurality of rows; and
    forming a die in each of the plurality of die regions.

10. The method of claim 9, wherein a shortest distance between the edge of the carrier and the corner of the edge die region is greater than 0 and substantially equal to or smaller than a half of a length of the die region after the shifting of each of the plurality of rows.

11. The method of claim 9, wherein the plurality of die regions are separated from each other by a plurality of scribing lines, and the plurality of scribing lines include a plurality of continuous lines along the first direction and a plurality of discontinuous lines along a second direction.

12. The method of claim 11, wherein the first direction is substantially orthogonal to the second direction.

13. The method of claim 11, wherein at least one of the plurality of continuous lines overlaps a first central horizontal axis of the carrier, at least one of the plurality of discontinuous lines overlaps a second central vertical axis of the carrier, and the plurality of dies are symmetrically arranged on the carrier about the first central axis and the second central axis.

14. The method of claim 13, wherein the plurality of rows are symmetrical about the first central axis and the second central axis.

15. A method for manufacturing a semiconductor device, comprising:
providing a carrier;
defining a plurality of die regions over the carrier along a first direction and a second direction to arrange the plurality of die regions in a plurality of rows and a plurality of columns, wherein each of the die regions has a first side parallel to the first direction and a second side parallel to the second direction,
identifying a row when a shortest distance between an edge of the carrier and the second side of a die region disposed at an end of the row is larger than a half of a length of the first side;
shifting the row along the first direction in a predetermined distance;
disposing an additional die region at an end of the shifted row; and
forming a die in each of the plurality of die regions and the additional die region, wherein the die regions are separated from each other by a plurality of first continuous lines extending along the first direction and a plurality of second continuous lines extending along the second direction before the identifying of the row, and the shifting of the row breaks the plurality of second continuous lines to form a plurality of discontinuous lines along the second direction.

16. The method of claim 15, wherein the plurality of die regions and the additional die region have similar dimension.

17. The method of claim 15, a shortest distance between the edge of the carrier and a corner of the additional die region is substantially equal to or smaller than a half of the length of the first side of the die region.

18. The method of claim 15, wherein the plurality of first continuous lines and the plurality of discontinuous lines form a plurality of scribing lines.

19. The method of claim 15, wherein at least one of the plurality of first continuous lines overlaps a first central axis of the carrier, at least one of the plurality of discontinuous lines overlaps a second central axis of the carrier, and the plurality of dies are symmetrically arranged on the carrier about the first central axis and the second central axis.

20. The method of claim 15, wherein the first direction is substantially orthogonal to the second direction.

* * * * *